United States Patent [19]
Habraken

[11] Patent Number: 4,796,796
[45] Date of Patent: Jan. 10, 1989

[54] SOLDERING APPARATUS

[75] Inventor: Johannes C. Habraken, Eindhoven, Netherlands

[73] Assignee: U.S. Philips Corp., New York, N.Y.

[21] Appl. No.: 33,142

[22] Filed: Mar. 31, 1987

[30] Foreign Application Priority Data

Apr. 10, 1986 [NL] Netherlands .......................... 8600905

[51] Int. Cl.⁴ .......................... H05K 3/34; B23K 1/02
[52] U.S. Cl. ...................................... 228/37; 228/179; 228/180.1
[58] Field of Search ...................... 228/37, 179, 180.1; 118/74, 410

[56] References Cited

U.S. PATENT DOCUMENTS

| | | | |
|---|---|---|---|
| 3,135,630 | 6/1964 | Bielinski et al. | 228/37 X |
| 3,465,415 | 9/1969 | Walls | 29/471.1 |
| 3,565,319 | 2/1971 | Eschenberger | 228/37 |
| 3,593,677 | 7/1971 | McLain | 228/37 X |
| 4,139,143 | 2/1979 | Gumprecht | 228/180.2 |

FOREIGN PATENT DOCUMENTS 628778 10/1961 Canada .
2084053 4/1982 United Kingdom .

Primary Examiner—Nicholas P. Godici
Assistant Examiner—Carmine Cuda
Attorney, Agent, or Firm—Robert T. Mayer

[57] ABSTRACT

Figure 3:
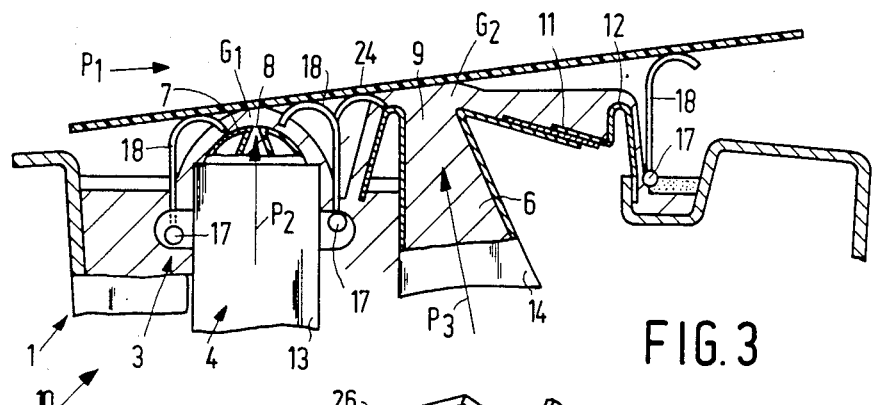

A soldering apparatus comprising a soldering station (10) with a system for producing at least one soldering wave (P2, P3) and a transport device extending above the soldering station (10). Several resilient supporting elements (18) are arranged in one or more rows at right angles to the direction of transport (P1) for resiliently supporting a printed circuit board (24) to be subjected to a soldering treatment. Due to the supporting elements (18), sagging of the board (24) and flushing of the board with solder are avoided (FIG. 3).

4 Claims, 2 Drawing Sheets

SOLDERING APPARATUS

The invention relates to a soldering apparatus for soldering components to a printed circuit board, this soldering apparatus mainly comprising a soldering station with at least one nozzle, means for forming at least one soldering wave, a transport device extending above the soldering station and comprising two parallel transport tracks for supporting two opposite edge strips of a printed-circuit board and a stationary supporting member supporting the board and arranged near the soldering station.

During the manufacture of electric circuits, electric components are soldered on a printed circuit board by passing the board over a soldering bath. In this soldering bath, the molten soldering material is shaped so as to form a wave, the crest of the wave touching the printed lower side of the board. In this manner, the components previously arranged on the upper side of the board are soldered to the wiring. The soldering bath may be provided here with one or with two waves. The crest of the wave extends at right angles of the direction of transport and in such equipment it is necessary for the board to remain as straight as possible in order that no soldering material reaches the upper side of the board. Various steps have already been taken to prevent the board from sagging between the transport tracks.

For example, it is generally known to arrange the board in a carrier supporting the board on all sides, This method is not flexible and is laborious because the board has to be arranged in the carrier and has to be removed again from the carrier after soldering.

A method in which no carriers are required is known from IBM Technical Disclosure Bulletin, Vol. 25, No. 7B, December 1982, p. 3876/7. In this case, the front and rear edges of the board are clamped between stiffening profiles. This method is also laborious because the profiles also have to be provided separately. Another solution, which renders separate supports superfluous, consists in that at least near the soldering station a fixed guide rail is arranged between the transport tracks, on which the lower side of the board is supported. Since it increasingly occurs that components are provided on both sides of the board, that is to say also on the printed lower side, which components also have to be fixed by soldering, such a guide rail cannot be arranged because those components which have been secured beforehand to the board by means of an adhesive, can be pushed off readily (IBM Technical Disclosure Bulletin, Vol. 26, No. 5, October 1983, p. 2324).

The invention has for its object to obviate the aforementioned disadvantages and for this purpose it provides an apparatus which is distinguished in that the stationary supporting member comprises at least one resiliently yielding supporting element. Due to the resiliently yielding element, the board is prevented from sagging. Nevertheless, components can be provided on the lower side of the board because the supporting element yields resiliently on the lower side. The risk of detachment of components is thus avoided.

The resiliently yielding supporting element can be readily exchanged when it is in the form of an elongate body secured with one end in a support and extending therefrom. Since the free end of the elongate body supports the lower side of the board, it is guaranteed that not only an easy exchangeability, but also a high flexibility are obtained.

A satisfactory guidance without the risk of repulsion of the components is ensured in that the free end of the elongate body is curved.

In a preferred embodiment of the soldering apparatus according to the invention several elongate bodies are arranged in one or more rows at right angles to the direction of transport. Thus, the board is supported throughout its width between the transport tracks and each elongate body can be made even more flexible, as a result of which any risk of detachment of components is further reduced.

In order to maintain the correct level of the board with respect to the crest of the wave, it is to be preferred to arrange the rows each time on either side of the nozzle.

In order to ensure that the elongate body becomes capable of withstanding the comparatively high temperatures occurring in the soldering bath, it is to be preferred to manufacture each elongate body from a wire of spring steel.

The invention will be described more fully with reference to the following Figures showing an embodiment.

Figure 1:
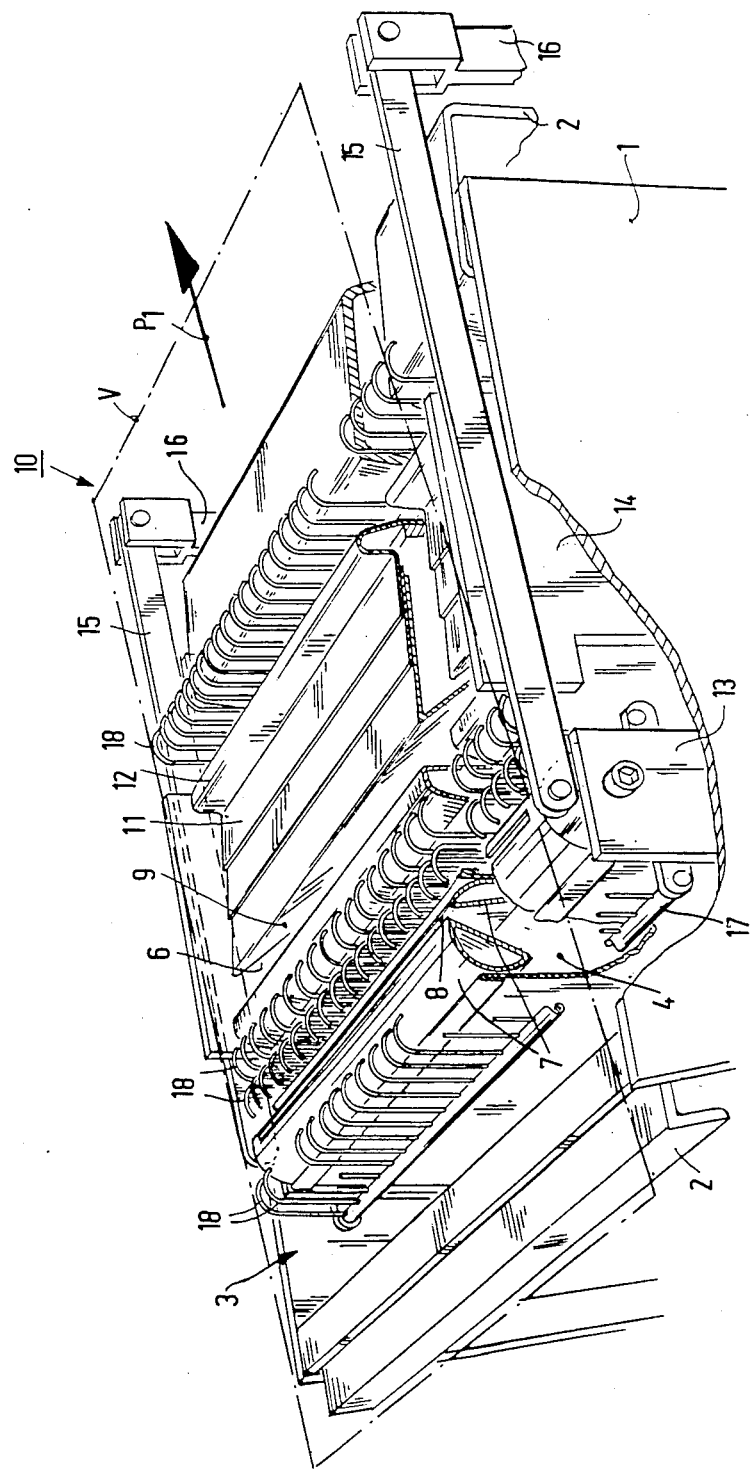
Figure 2:
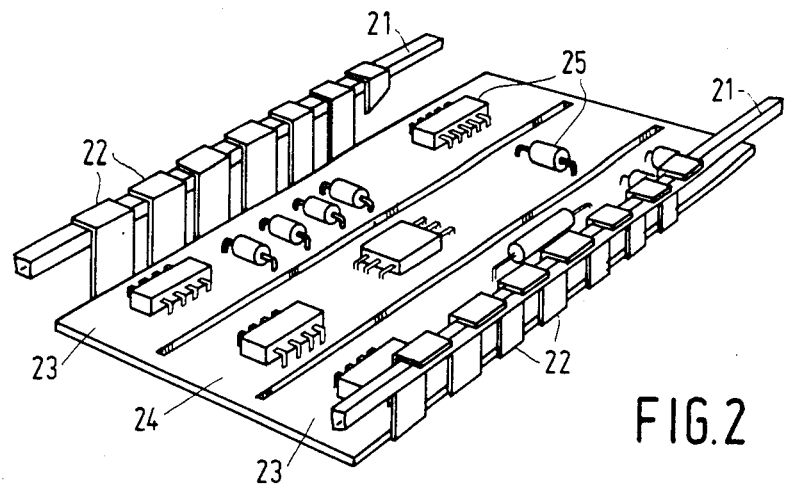
Figure 4:
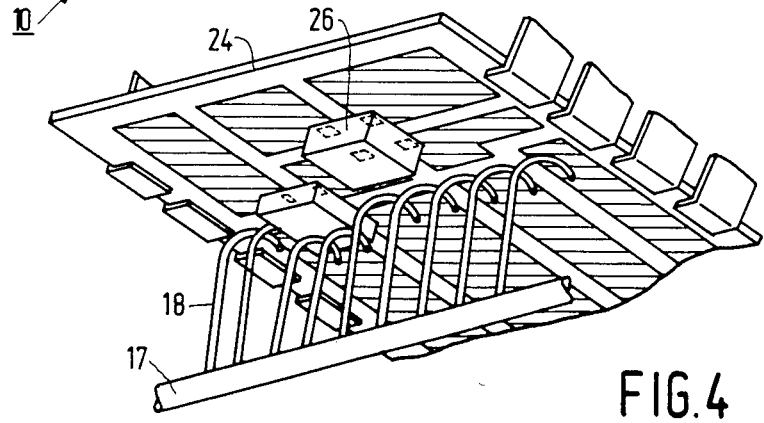

IN THE DRAWING;

FIG. 1 is a perspective view of a part of a soldering apparatus, i.e. the soldering station with stationary supporting members according to the invention, FIG. 2 is a perspective plan view of a possible transport device associated with the soldering apparatus with a board suspended therein, FIG. 3 is an upright longitudinal sectional view of the soldering bath of FIG. 1 provided with two soldering waves, FIG. 4 is a perspective bottom view of a board which is suspended in the transport device and is supported by the preferred embodiment of the resiliently yielding supporting elements according to the invention.

The soldering station 10 of a soldering apparatus shown in FIGS. 1 and 2 is given purely by way of example and the invention is not limited to this embodiment.

Side plates 1 of a framework not shown further are interconnected by transverse members 2 in such a manner that a trough 3 for molten solder can be arranged between the plates 1. This trough 3 accommodates two vertically arranged elongated channels 4, 6, the channel 4 being closed on the upper side by a nozzle 7 comprising two cylindrical segments tapering towards each other in such a manner that a gap 8 is formed on the upper side. The gap 8 extends between the side plates 1, that is at right angles to the transport direction to be described below for the printed circuit boards to be processed.

The channel 6 also has on the upper side a gap 9, but his gap has a larger width than the gap 8 of the channel 4. On the righthand side in FIG. 1 of the gap 9, a guide plate 11 with an upright threshold 12 is provided.

The channels 4 and 6 are supported by side plates 13, 14, whose height is adjustable with respect to the trough 3 in a known manner. By means of pivot arms 15 and levers 16, the width of gap 8 of nozzle 7 can be adjusted.

According to the invention, the soldering apparatus is provided with resiliently yielding supporting elements for supporting a board to be passed above the soldering station 10. In this case, these supporting elements are in the form of elongate bodies 18, which are secured on a support 17 and which extend upwards from the support 17. The elongate bodies 18 are arranged in rows on either side of the gaps 8 and 9, respectively, so that in the embodiment shown in FIG. 1 four rows are used. The elongate bodies 18 are each curved at the ends remote from the support 17. Each support 17 is secured to the side plate 13 and 14, respectively, so that the bodies 18 together with the supports 17 and the side plates 13 and 14 are adjustable in height.

As already stated above, the soldering station 10 shown in FIG. 1 forms part of a soldering apparatus, which can be provided with two parallel transport tracks 21 as shown in FIG. 2. The transport tracks 21 are in the form of transport chains and are provided with suspension members 22, on whose lower side the side edge strips 23 of a printed circuit board 24 to be processed are supported. The board 24 may consist of a single board or of two or more (in this case three) board portions temporarily secured to each other and later to be used independently of each other.

Since the board 24 is supported only at the side edge strips, it will be appreciated that due to the heat, for example, in the soldering station 10 shown in FIG. 1, but also elsewhere in the equipment, for example, during preheating, the board will sag between the transport tracks 21.

The transport tracks 21 are considered to ascend slightly in such a manner that the board 24 is transported in the sloping plane V in FIG. 1 in the direction of the arrow P1.

The operation of the apparatus described above will be explained more fully with reference to FIGS. 3 and 4. The trough 3 is provided with means for causing the molten solder to ascend in the channels 4 and 6 in the direction of the arrows P2, P3. The channel 4 is constructed in such a manner with the narrow gap 8 that the solder emanates as a high pressure soldering wave $G_1$ directed against the lower side of a board 24. Due to this strong soldering wave, a satisfactory and complete wetting of the parts to be soldered is obtained. The soldering wave $G_1$ emanating from the gap 8 is returned to the trough 3 on either side of the cylindrical segments 7. The molten solder from the channel 6 is drained because of the wider gap 9 in a comparatively mild wave $G_2$ uniformly over the edge of the gap 9 on either side, this wave serving to take along excess solder on the lower side of the board 24, which has been left behind due to the violent supply of the first wave $G_1$ through the gap 8. The operation of a soldering bath of this type is known and will not be described further. It will be appreciated that the dimensioning and the adjustment of the channels 4 and 6 and of the gaps 8 and 9 are such that with an accurate adjustment with respect to the transport tracks 21 the crests of the waves $G_1$ and $G_2$ at the gaps 8 and 9, respectively, touch exactly the lower side of the board 24.

The aforementioned risk of sagging of the board 24 between the transport tracks 21 and of flushing of the board 24 with molten solder is avoided by the resiliently yielding elements arranged in rows of elongate bodies 18 at right angles to the direction of transport P1, which support the board 24 throughout its width on the lower side.

On the upper side, the board 24 is provided with conventional components 25. If the board 24 is provided on the lower side with components 26 secured by means of an adhesive, these components 26 will not be pushed off by the elongate resilient bodies 18 because these are sufficiently flexible so that they bend easily laterally or downwards. The board is continuously supported at the correct level by the remaining elongate bodies 18.

Due to the curved ends, the elongate bodies will ascend and descend, respectively, along the components 26 without problems.

The elongate bodies 18 can be readily exchanged due to the fact that they are detachably arranged in recesses (not shown) of the support 17.

The invention is not limited to the embodiment described above of resiliently yielding supporting elements The wire-shaped elongate body 18 may also be replaced by a more strip-shaped body, for example a spring blade. The supports 17 may also be arranged at a higher level and the elongate bodies 18 may extend more horizontally.

Within the scope of the invention, it is also possible that resiliently yielding the strips or wires extend throughout the length of the soldering bath between two supports arranged on either side thereof.

The resiliently yielding supporting elements according to the invention need further not be arranged at a single soldering station, but may also be arranged at other stations in the soldering equipment.

What is claimed is:

1. A soldering apparatus for soldering components to a printed circuit board, said soldering apparatus comprising a soldering station with at least one nozzle, means for forming at least one soldering wave, a transport device extending above the soldering station for transporting a printed circuit board in a predetermined direction past said at least one soldering wave, said transport device comprising two parallel transport tracks for supporting two opposite edge strips of a printed circuit board, support means and a supporting member affixed to said support means for supporting a printed circuit board, said supporting member being arranged near the soldering station, said supporting member comprising at least one resiliently yielding supporting element, said resiliently yielding supporting element being in the form of an elongate body or bodies having one end secured to said support means, each said elongate body extending from said support means toward said transport device, each said elongate body having a curved free end.

2. An apparatus as claimed in claim 1, wherein said at least one resiliently yielding supporting element is in the form of a plurality of said elongate bodies each having one end secured to said support means, said elongate bodies extending from said support means towards said transport device and wherein said elongate bodies are arranged in one or more rows which extend at right angles to said predetermined direction.

3. An apparatus as claimed in claim 2 wherein said elongate bodies are arranged in rows on either side of said nozzle.

4. An apparatus as claimed in any one of claims 1, 2 or 3, wherein each elongate body is manufactured from a wire of spring steel.

* * * * *